United States Patent
Roy et al.

(10) Patent No.: US 10,699,764 B1
(45) Date of Patent: Jun. 30, 2020

(54) MRAM MEMORY WITH OTP CELLS

(71) Applicant: NXP USA, INC., Austin, TX (US)

(72) Inventors: Anirban Roy, Austin, TX (US); Nihaar N. Mahatme, Austin, TX (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 16/220,170

(22) Filed: Dec. 14, 2018

(51) Int. Cl.
  G11C 11/16 (2006.01)
  H01L 27/22 (2006.01)
  H01L 43/08 (2006.01)

(52) U.S. Cl.
  CPC ...... G11C 11/1675 (2013.01); G11C 11/1655 (2013.01); G11C 11/1657 (2013.01); G11C 11/1659 (2013.01); G11C 11/1673 (2013.01); H01L 27/226 (2013.01); H01L 43/08 (2013.01)

(58) Field of Classification Search
  CPC .................. G11C 11/1675; G11C 11/1673
  USPC .................................................. 365/158, 171
  See application file for complete search history.

(56) References Cited

U.S. PATENT DOCUMENTS

| | | | |
|---|---|---|---|
| 8,018,759 B2 * | 9/2011 | Kano | G11C 11/005 365/148 |
| 8,923,044 B2 * | 12/2014 | Li | H01L 43/12 365/148 |
| 9,165,631 B2 * | 10/2015 | Kim | G11C 11/1675 |
| 9,245,610 B2 | 1/2016 | Kim et al. | |
| 9,455,015 B2 * | 9/2016 | Slaughter | G11C 17/16 |
| 9,614,144 B1 | 4/2017 | Annunziata et al. | |
| 9,679,663 B2 * | 6/2017 | Kim | G11C 11/16 |
| 9,805,816 B2 * | 10/2017 | Jan | G11C 11/1673 |
| 2004/0057281 A1 | 3/2004 | Ooishi | |
| 2010/0220517 A1 * | 9/2010 | Okayama | G11C 7/20 365/158 |

(Continued)

FOREIGN PATENT DOCUMENTS

| | | |
|---|---|---|
| CN | 106128496 A | 11/2016 |
| WO | 2015153060 A1 | 10/2015 |

OTHER PUBLICATIONS

Cheng, H.W., "A Novel Rewritable One-Time-Programming OTP (RW-OTP) Realized by Dielectric-fuse RRAM Devices Featuring Ultra-High Reliable Retention and Good Endurance for Embedded Applications", IEEE 2018.

(Continued)

*Primary Examiner* — Son L Mai
(74) *Attorney, Agent, or Firm* — David G. Dolezal; Joanna G. Geld

(57) ABSTRACT

A magnetoresistive random access memory (MRAM) includes an MRAM array having MRAM cells, each including a Magnetic Tunnel Junction (MTJ). The MRAM includes data write circuitry configured to write in one-time-programmable (OTP) write mode or in a non-OTP write mode. In the OTP write mode, the data write circuitry is configured to provide a high write voltage magnitude across selected MRAM cells of a first plurality of MRAM cells so as to permanently blow the corresponding tunnel dielectric layers of the selected MRAM cells. In the non-OTP write mode, the data write circuitry is configured to provide a lower write voltage magnitude across selected MRAM cells so as to set a magnetization of the corresponding free layer of each MRAM cell to modulate a resistance of each MRAM cell, without blowing the corresponding tunnel dielectric layer of each MRAM cell.

20 Claims, 5 Drawing Sheets

(56) References Cited

U.S. PATENT DOCUMENTS

2010/0328992 A1 12/2010 Kano et al.
2015/0103586 A1 4/2015 Kim et al.
2016/0093672 A1 3/2016 Li et al.
2016/0104519 A1 4/2016 Slaughter et al.
2016/0293268 A1 10/2016 Jan et al.

OTHER PUBLICATIONS

Jan, G., "Demonstration of an MgO Based Anti-Fuse OTP Design Integrated With a Fully Functional STT-MRAM at the Mbit Level", Symposium on VLSI Technology Digest of Technical Papers, 2015.
SoC for IOT: Antifuse NVM for Security and Low Power, Kilopass (now Synopsys), Mar. 2015.

\* cited by examiner

| CELL | 0 | 1 | 2 | 3 | 4 | 5 | 6 | 7 |
|---|---|---|---|---|---|---|---|---|
| CELL RESISTANCE | HR | LR | B | HR | HR | B | LR | LR |
| VALUE / OTP MODE | 1 | 1 | 0 | 1 | 1 | 0 | 1 | 1 |
| VALUE / MRAM MODE | 1 | 0 | 0 | 1 | 1 | 0 | 0 | 0 |

MRAM MEMORY WITH OTP CELLS

BACKGROUND OF THE INVENTION

Field of the Invention

This invention relates in general to an MRAM and more specifically to an MRAM with OTP cells.

Background

A Magnetoresistive Random Access Memory (MRAM) is a memory whose memory cells store information using magnetic states. With some MRAM, nonvolatile data can be stored and cells can be written multiple times over the life of the memory.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an MRAM includes an array of MRAM cells that can be utilized as reprogrammable MRAM cells or as one-time programmable (OTP) devices. In some embodiments, some MRAM cells of the array can be used as OTP devices where the tunnel dielectric layers of the magnetic tunnel junctions (MTJs) of the cells are "blown" during an OTP mode write to provide a permanent resistance that is determinable from the resistance of an unblown cell, regardless of the magnetic state of the cell. In a non-OTP write mode, the direction of magnetization of the free layer of the MTJ is set to store a particular logic value. During a non-OTP mode write, the dielectric tunnel layers of the cells are not blown. In some embodiments, the MRAM has two read modes. One read mode is for reading the OTP cells of the MRAM array and the other is for reading the magnetic states of the non-OTP cells of the array. In some embodiments, the different modes involve providing different reference resistances to sense amplifiers during a read operation of the MRAM.

Figure 1:
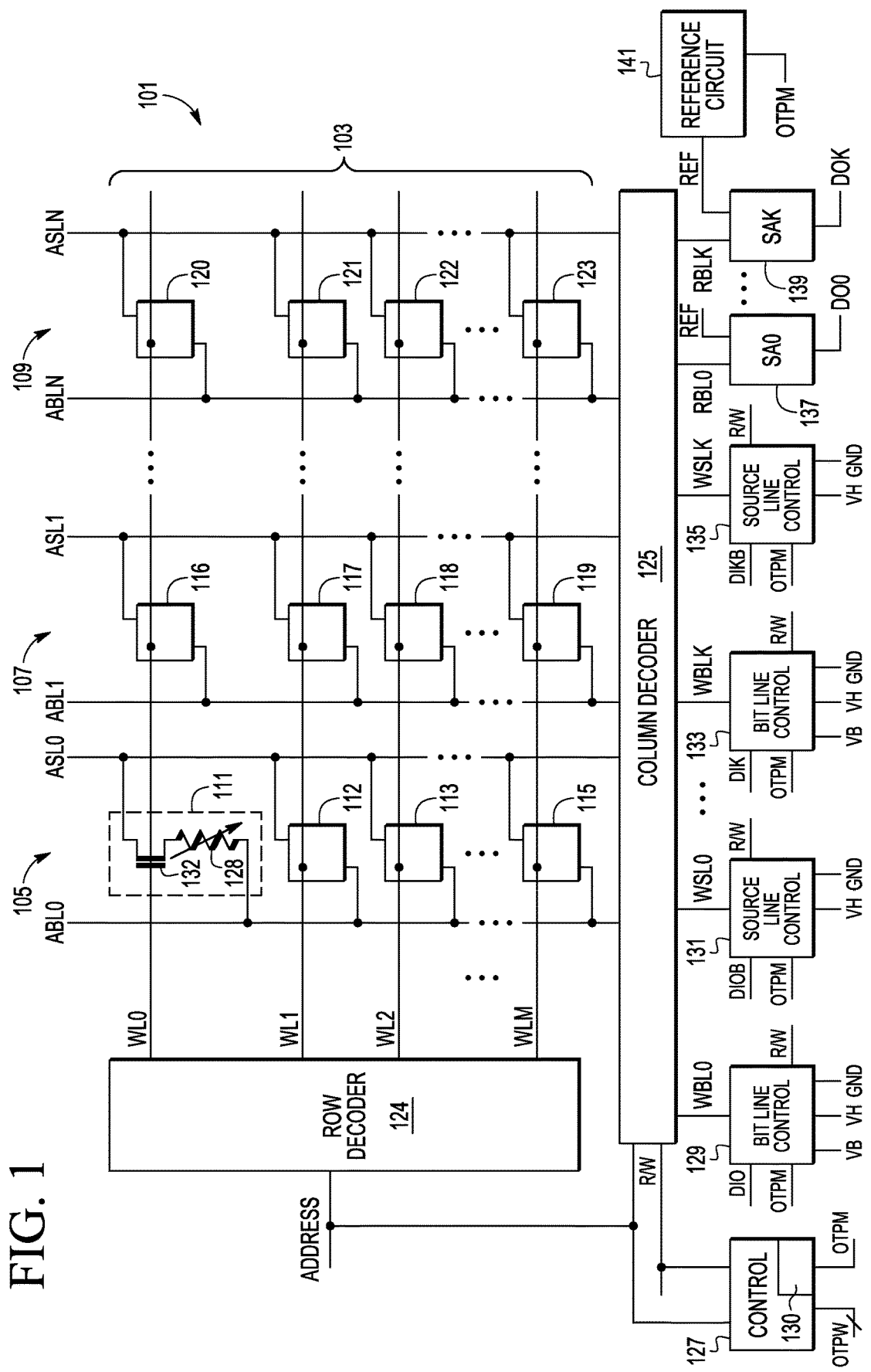
FIG. 1 is a diagram of an MRAM according to one embodiment of the present invention.

FIG. 1 is a diagram of an MRAM according to one embodiment of the present invention. Memory 101 includes array 103 of MRAM cells located in rows and columns (105, 107, and 109) for storing data. Column 105 includes cells 111-115, column 107 includes cells 116-119, and column 109 includes cells 120-123. In one embodiment, each cell (111) is characterized as an MRAM cell that includes a magnetic tunnel junction (MTJ) (128 for cell 111) and an access transistor (132 for cell 111) whose control terminal is coupled to a word line (WL0-WLM) that is asserted to access a specific row of memory cells for either reads or writes to the cells. The MTJs and access transistors for cells 112-123 are not shown in the view of FIG. 1. The word lines (WL0-WLM) are provided by an address row decoder 124 and are selectively asserted based on a memory address of an access request received by decoder 124 on address lines (ADDRESS) from processing circuitry (not shown). Each cell (111) of a column is connected to an array bit line (ABL0-ABLN) and an array source line (ASL0-ASLN) of the column. In the embodiment shown, a cell (111) is connected to the source line (ASL0) at the source of the access transistor (132). Although FIG. 1 shows that array 103 includes four rows (corresponding to word lines WL0-WLM) and three columns (105, 107, and 109), other embodiments may include a different number of rows (M) and/or a different number of columns (N).

In some embodiments, the MTJs of the cells of MRAM array 103 have the same structure. As used herein, MTJs having the same structure mean that the corresponding structures of the MTJs have the same physical dimensions and are made of the same materials within manufacturing tolerances. As used herein with respect to information stored in a memory, the term "data" also includes instructions or commands stored in a memory.

Memory 101 includes data read circuitry for reading data stored in the cells of array 103. In the embodiment shown, the read circuitry includes sense amplifiers 137 and 139, each for sensing the data value stored in a memory cell by comparing the resistance of the memory cell to a reference resistance (REF). During a read operation, a sense amplifier (137) is coupled to a bit line (e.g. ABL0) of a selected column (e.g. 105) by column decoder 125 to compare a resistance of a selected cell (e.g. 111) of that column to the reference resistance (REF). The sense amplifiers 137 and 139 output the read data (DO0-DOK) to processing circuitry (not shown) on a data bus (not shown). The reference resistance is provided by a reference circuit 141.

Memory 101 includes data write circuitry for writing data to memory cells of array 103. In the embodiment shown, the data write circuitry includes bit line control circuits 129 and 133 for controlling the voltage of the array bit lines (ABL0, ABLN) of selected columns during a memory write operation to selected cells of the array. The data write circuitry also includes source line control circuits 131 and 135 for controlling the voltage of the array source lines (ASL0, ASLN) of selected columns during a memory write operation to selected cells.

In the embodiment shown, column decoder 125 selectively couples the array bits lines (ABL0, ABL1, ABLN) of selected array columns (105, 107, and 109) to the bit line control circuits (129 and 133) and selectively couples the corresponding array source lines (ASL0, ASL1, and ASLN) of the selected array columns to the source line control circuits (131 and 135) during a memory write operation. In the embodiment shown, column decoder 125 selectively couples the array bits lines (ABL0, ABL1, ABLN) of selected columns (105, 107, and 109) to sense amplifiers (137 and 139) and selectively couples the array source lines (ASL0, ASL1, ASLN) of selected columns to the source line control circuits (131 and 135) during a memory read operation.

In one embodiment, the decode ratio (N/K) of decoder 125 is 8 to 1, where N is the number of array columns and K is the number of sense amplifiers/line control circuit pairs. However, this ratio may be of other values in other embodiments (e.g. 1, 4, 16). In one embodiment, K is 64 and N is 512, but these may be of different values in other embodiments. Some embodiments do not include a column decoder where each column includes its own sense amplifier and bit line control circuit/source line control circuit pair. In some embodiments, the bit line control circuit (129) may be integrated with a sense amplifier (137). The column decoder 125 receives a portion of the address from the address lines and the read/write (R/W) signal for determining which columns are selected.

In one embodiment, memory 101 is located on the same integrated circuit as the processing circuitry (not shown) that requests the memory accesses. In other embodiments, memory 101 may be located on a separate integrated circuit. In still other embodiments, memory 101 may have other configurations.

The cells of array 103 can be utilized in an MRAM mode where data can be written, read, and nonvolatility stored in a cell or can be utilized in a OTP mode where a data state is permanently programmed in the cell. In one embodiment, the cells can be implemented in the OTP mode on a row by row basis and/or on a column by column basis.

Figure 2:
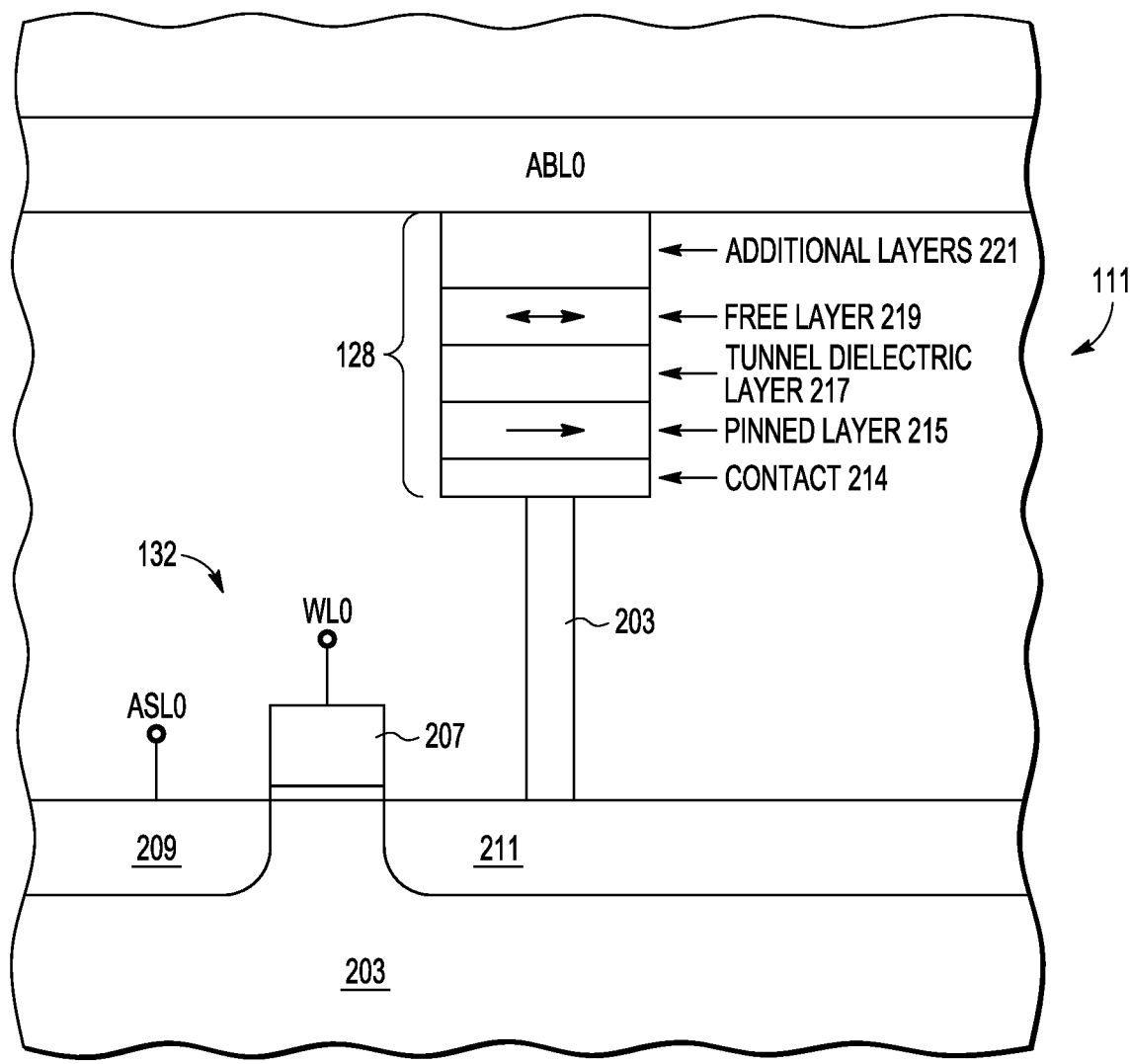
FIG. 2 is a side view of a MRAM cell of FIG. 1 according to one embodiment of the present invention.

FIG. 2 is a side view of MRAM cell 111 according to one embodiment of the present invention. In the embodiment shown, access transistor 132 of cell 111 is a planar transistor with a source region 209 and drain region 211 located in a semiconductor substrate 203 of an integrated circuit. Source region 209 is connected to array source line ASL0. Drain region 211 is connected to magnetic tunnel junction (MTJ) 128 by via 203 which is located in one or more interconnect layers of the integrated circuit of the MRAM. The gate 207 of transistor 132 is connected to word line WL0.

In the embodiment shown, MTJ 128 includes a conductive contact layer 214, a pinned magnetic layer 215, a tunnel dielectric layer 217, and a free magnetic layer 219. In the embodiment shown, MTJ 128 also includes additional layers 221 that include conductive layers. In one embodiment, pinned magnetic layer 215 and free magnetic layer 219 are made of ferromagnetic materials such as cobalt iron boron (CoFeB) and tunnel dielectric layer is made of a dielectric material such as magnesium oxide (MgO). However, these layers may be made of other materials in other embodiments. Also in other embodiments, an MRAM cell may have other configurations.

The magnetization direction of the pinned layer 215 is fixed. The magnetization direction of free layer 219 can be programmed to be in a parallel direction or an anti-parallel direction to the magnetization direction of pinned layer 215 in order to store a 1 or 0 value in the memory cell. When the magnetization direction of free layer 219 is in an anti-parallel direction, the resistance of the MTJ is at a relatively high value. When the magnetization direction of free layer 219 is in a parallel direction, the resistance of the MTJ is of a relatively lower value. When a sense amplifier is coupled to both the array bit line of the cell and to a reference resistance that is in between the high resistive value and the low resistive value during a read in an MRAM mode, a determination can be made as to whether a 1 value (e.g. high resistance state) or a 0 value (e.g. low resistance state) is stored in the MTJ.

During a write operation in an MRAM mode, the magnetization direction of free layer 219 can be set by applying a voltage differential of sufficient magnitude across the MTJ to generate the desired magnetic fields for setting the magnetization direction of free layer 219. In one embodiment, the magnetization direction of free layer 219 can be set by in one direction by applying a higher voltage (VH) to the array bit line (ABL0) and a lower voltage (Gnd) to the source line (ASL0) when transistor 132 is conductive, and by can be set in the other direction by applying the lower voltage (Gnd) to the array bit line and the higher voltage (VH) to the array source line.

In one embodiment, layers 214, 215, 217, 219, and 221 have a circular disk configuration where the width shown in FIG. 2 is the diameter of the circle. The greater the surface area of the circle, the higher the voltage differential needed to switch the resistive state of the cell. In one embodiment, the voltage differential between VH and ground is in the range of 1-2 Volts, but may be of other values in other embodiments.

During a write operation in an OTP mode, a sufficiently higher voltage differential can be applied between the array bit line and array source line when transistor 132 is conducive to permanently break down the resistance of tunnel dielectric layer 217 to where the MTJ 128 has a relatively low resistance value as compared to the resistance value of an unblown cell (either the high resistance state or the low resistance state) where the tunnel dielectric layer is not broken down. As used herein, a cell whose tunnel dielectric has been permanently broken down is referred to as a "blown" cell. Once a cell has been blown, it cannot be reprogrammed to provide a high resistive value or a lower resistive value regardless of the magnetization direction of free layer 219.

Referring back to FIG. 1, the data write circuitry of memory 101 includes circuitry for performing an MRAM mode write and an OTP mode write. Control circuit 127 provides an OTPM signal to the bit line control circuits 129 and 133 and the source line control circuits 131 and 135 to control whether these circuits are in an MRAM mode or an OTP mode for writing data to a memory cell. During a write operation, the bit line control circuits 129 and 133 each receive a data input value (DI0, DIK) and the corresponding source line control circuits 131 and 135 each receives a complementary data input value (DI0B, DIKB). In the embodiment shown, circuits 129, 131, 133, and 135 receive the read/write signal (R/W) which would indicate a write during a write mode. If in an MRAM write mode (the OTPM signal is not asserted), bit line control circuits 129 and 133 provide either the high voltage (VH) or low voltage (Gnd) to the selected bit lines (via column decoder 125) depending on the values of DI0 and DIK, respectively, to be written to the cells. During an MRAM mode write, source line control circuits 131 and 135 provide the opposite voltage values (VH or Gnd) as provided by circuits 129 and 131, respectively so that the voltage differential across each cell has the appropriate polarity to write the desired value to the cell.

During an OTP mode write (when the OTPM signal is asserted), the bit line control circuits 129 and 133 provide the higher voltage (VB) for blowing a cell or the lower voltage (e.g. VH or Gnd) for not blowing a cell depending upon whether a 0 or 1 is to be written to the cell. If a 0 is be written, then the bit line control circuit (129) provides the voltage VB to the bit line to blow the cell. If a 1 is to be written, then the bit line control circuit (129) provides a lower voltage (e.g. VH or Gnd) to the cell such that the cell is not blown. During an OTP mode write according to one embodiment, source line control circuit 131 provides the lower voltage (Gnd) to the source line regardless of whether a 1 or 0 is to be written to the cell.

In the embodiment shown, bit line control circuits 129 and 133 and source line control circuits 131 and 135 are shown as receiving voltages VB, VH, and ground (Gnd) (e.g. from voltage regulators (not shown)) and selectively supplying one of those voltages to the bit line. In other embodiments, the bit line control circuits and source line control circuits may include voltage regulators and/or charge pumps whose output voltages are adjustable for providing the different voltages. Also, the lower voltage level may be another voltage level (e.g. a negative voltage level such as 200 mV) other than ground.

In other embodiments, the bit line control circuits 129 and 133 may provide the same high voltage level for both an MRAM mode write and an OTP mode write. In such an embodiment, the source line control circuits 131 and 135 provide a lower voltage during an OTP mode write than during an MRAM mode write for providing a greater voltage differential across an MTJ cell during an OTP mode write for blowing the MTJ of the MRAM cell.

Memory 101 also includes read circuitry that can read the MRAM cells of array 103 in both an MRAM mode and an OTP mode. In the embodiment shown, memory 101 includes sense amplifiers 137 and 139 that each receive a reference resistance (REF) from reference circuit 141. Reference resistance is selectable between two different resistance values, one for MRAM mode reads and one for OTP mode reads.

Figure 3:
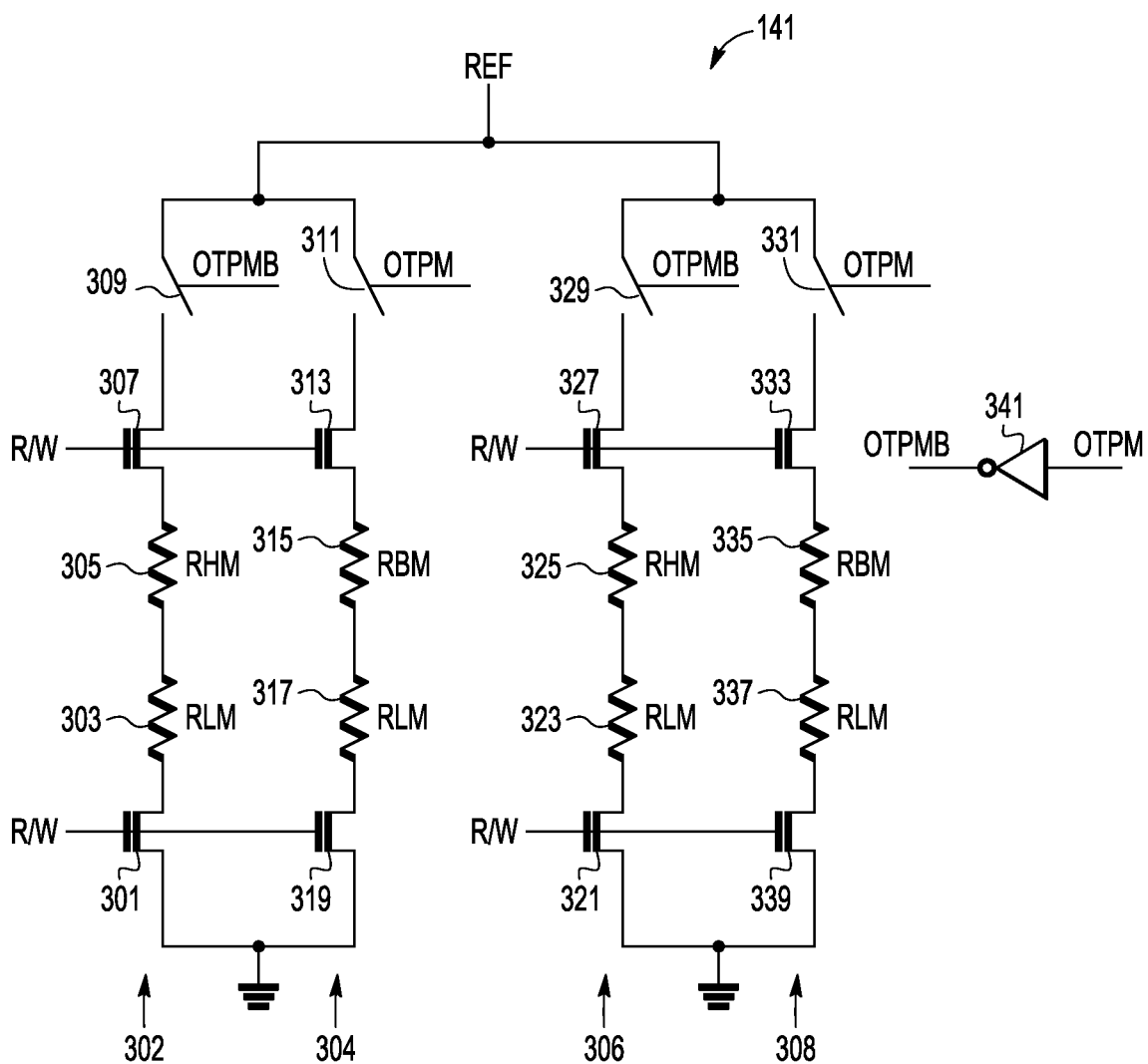
FIG. 3 is a circuit diagram of a reference resistance circuit according to one embodiment of the present invention.

FIG. 3 is a circuit diagram of one embodiment of a reference circuit 141 according to one embodiment. Circuit 141 is designed to provide a different reference resistance during an OTP mode read than during an MRAM mode read. In the embodiment shown, circuit 141 includes four current legs 302, 304, 306, and 308. Circuit 141 includes transistors 307, 313, 327, 333, 301, 319, 321, and 339 which are of the same size as the access transistors (132) of the MRAM cells (128). These transistors are made conductive when the R/W signal indicates a read.

Resistors 305 and 325 are sized to provide the same resistance (RHM) as an MTJ programmed in a high resistive state. Resistors 303, 317, 323, and 337 are sized to provide the same resistance (RLM) as an MTJ programmed in a low resistive state. Transistors 315 and 335 sized to provide the same resistance (RBM) as an MTJ in a blown state. Circuit 141 includes low impedance switches 309, 311, 329 and 331. Switches 309 and 329 are closed to couple legs 302 and 306 to provide the reference resistance during an MRAM mode read and switches 311 and 331 are closed to couple legs 304 and 308 to provide the reference resistance during an OTP mode read. Circuit 141 includes an inverter 341 that receives the OTPM signal and provides an inverted OTPMB signal that is used to control switches 309 and 329.

When in an MRAM mode read, circuit 141 provides a reference resistance of (RH+RL)/2, which is half way between RH and RL. RH is the resistance of an MRAM cell programmed in a high resistance state, which is equal to RHM+RS, where RS is the resistance of one of transistors 307, 313, 327, 333, 301, 319, 321, and 339 in a closed state. RL is the resistance of an MRAM cell in a low resistance state, which is equal to RLM+RS. When in an OTP mode read, circuit 141 provides a reference resistance of (RB+RL)/2, which is half way between RB and RL. RB is the resistance of a blown cell, which is equal to RBM+RS. Because RB is much less than RH, the OTP mode read resistance is much lower than the MRAM mode read resistance. In one embodiment, RHM is 25 k ohms, RLM is 10 k ohms, RBM is 2 k ohms, and RS is 2 k ohms, but these may be of other values in other embodiments. Other reference cells may have other configurations in other embodiments.

Figures 4, 5:
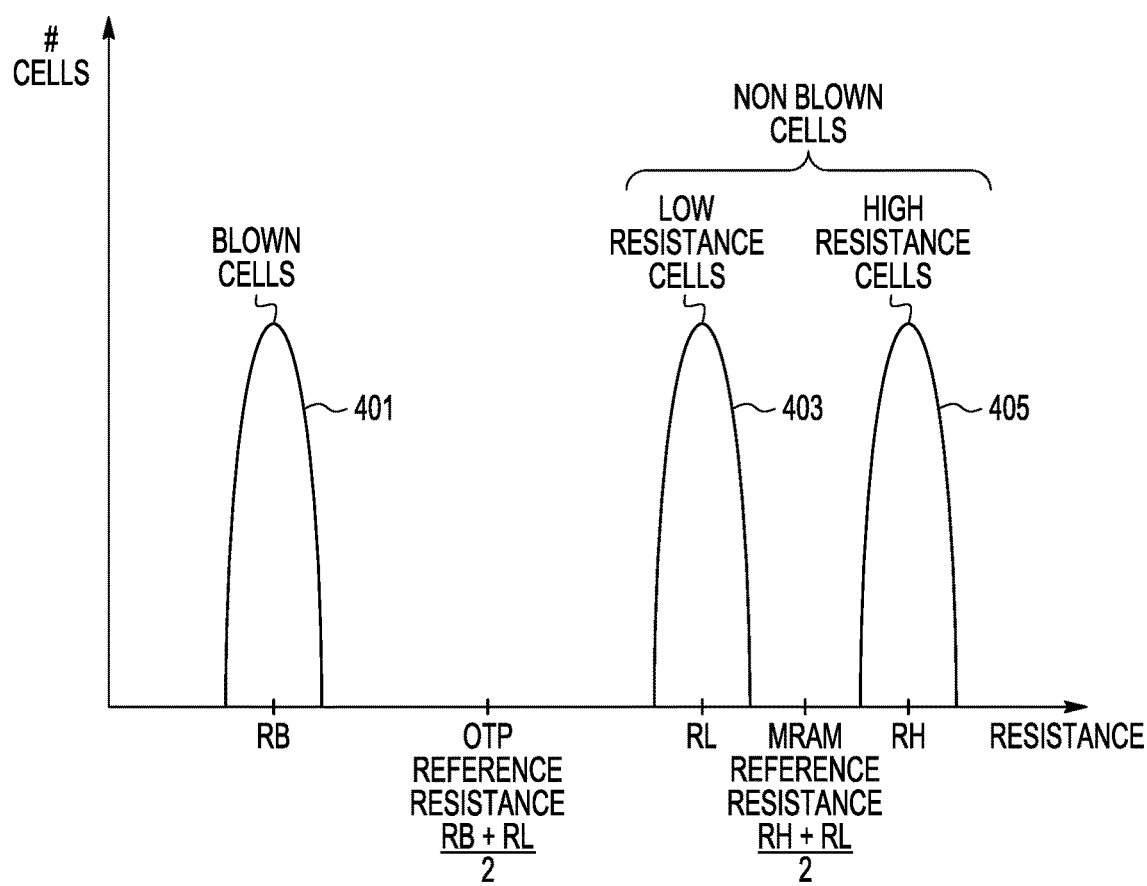
FIG. 4 is a graph showing a distribution of resistances of cells of an MRAM array according to one embodiment of the present invention.
FIG. 5 is chart illustrating the relationship between resistance states and data values for an MRAM read mode and an OTP read mode according to one embodiment of the present invention.

FIG. 4 is a graph showing a distribution of resistances of cells of a MRAM array according to one embodiment of the present invention. In FIG. 4, the resistance values are on the X axis and the number of cells having a particular resistance are on the Y axis. FIG. 4 shows the resistance distribution for cells of an MRAM array that are blown and those that are not blown. The cells that are not blown are either in a low resistance state or a high resistance state depending upon in one embodiment, whether the magnetization direction of the free layer of its MTJ is in a parallel or anti-parallel direction with the magnetization of the fixed layer.

In the embodiment shown, the blown cells have a resistance distribution 401 centered on the resistive value RB. The low resistance state cells have a resistance distribution 403 centered on RL, and the high resistance state cells have a resistance distribution 405 centered on resistance RH. The OTP mode reference resistance is centered half way between RB and RL. The MRAM mode reference resistance is centered half way between RL and RH.

During an MRAM mode read, providing a sense amplifier with the MRAM reference resistance allows for the sense amplifier to distinguish between a low resistance cell and a high resistance cell to determine whether the cell is storing a 0 or a 1. During an OTP mode read, providing a sense amplifier with the OTP reference resistance allows for the sense amplifier to distinguish between a blown cell and a non-blown cell, regardless of whether the non-blown cell has a low resistance state or a high resistance state.

FIG. 5 is chart illustrating the relationship between resistive states and data values for an MRAM read mode and an OTP read mode according to one embodiment. The top line identifies the cell numbers for 8 MRAM cells that have been subjected to an OTP mode write of 11011011. In one embodiment, during an OTP mode write, cells that are written with a "0" value are blown (represented as a "B" in the second line). Cells that are written to with a "1" are not blown and can be at either a high resistance state (HR) or a low resistance state (LR).

If the cells are read during an OTP mode with the OTP mode reference resistance provided to the eight sense amplifiers providing the output data values, then the values of 11011011 will be read in that a 1 value will be read for either a high resistance state or a low resistance state. See line three of FIG. 5.

However, if the cells were to be read in an MRAM mode where the MRAM mode reference resistance is provided to the sense amplifiers, then the sense amplifiers would return a value of 10011000, where both low resistance cells and blown cells would provide a 0 value.

In one embodiment, because during an OTP mode write, only the cells that are written with a 0 are blown, memory 101 uses a lower OTP mode reference resistance to read the cells in order to determine whether a cell was blown or not blown, regardless of whether the non-blown cell has a high resistance value or a low resistance value. In some embodiments, this may allow a group of cells to be used as OTP cells even if the non-blown cells are subsequently written with a high resistance value or a low resistance value.

With some embodiments, one advantage of using a lower OTP reference resistance is that the stored value of the OTP non-blown cells may not be changed when subjected to an external magnetic field. With some MRAM cells, exposing an MRAM to an external magnetic field may cause the MRAM cells to switch magnetic states (e.g. from a high resistance state to a low resistance state or vice versa). However, because the read circuitry of the MRAM distinguishes between a blown cell and a non-blown cell regardless of the resistive state of the non-blown cell, OTP stored data may not be corrupted by an external magnetic field. Such a feature may be advantageous in thwarting a malicious attack on the MRAM with an external magnetic field. In some embodiments, bootup code may be programmed in the MRAM by an OTP mode write. If a magnetic field attack is detected in a system utilizing the MRAM, the system can reboot from the code in the OTP mode written cells as opposed to rebooting from possibility corrupted code in the MRAM mode written cells.

Furthermore, because the MTJs of the cells of array 103 all have the same structure, it may be more difficult in some embodiments, for a third party to reverse engineer the OTP mode written code in the MRAM. With some other prior art MRAMs using MRAM cells as OTP devices, the OTP MRAM cells have a different structure (e.g. different size) which makes determining the location of such cells devices relatively easier. Whereas with some embodiments of the present invention, the location of the OTP cells cannot be determined by the physical shape of the MTJ, thereby making the content in those cells more obscure.

Referring back to FIG. 1, in the embodiment shown, control circuit 127 has a memory 130 for storing which rows and/or array columns include OTP cells to be written to and read from in an OTP mode. In one embodiment, the memory may be programmable by the integrated circuit manufacturer, by the system manufacturer, or by the end user. In some embodiments, MRAM 101 may be configured such that access to memory 130 is encrypted to prevent an unauthorized access to the memory. In one embodiment, the memory is a non-volatile memory and is written to by OTPW lines. In still other embodiments, the rows and/or array columns of the OTP cells are fixed (e.g. limited to circuit addresses hardwired into control circuit 127). In some embodiments, the rows/columns that contain OTP cells would be located in nonconsecutive addresses to hide the OTP cells from reverse engineering.

Figure 6:
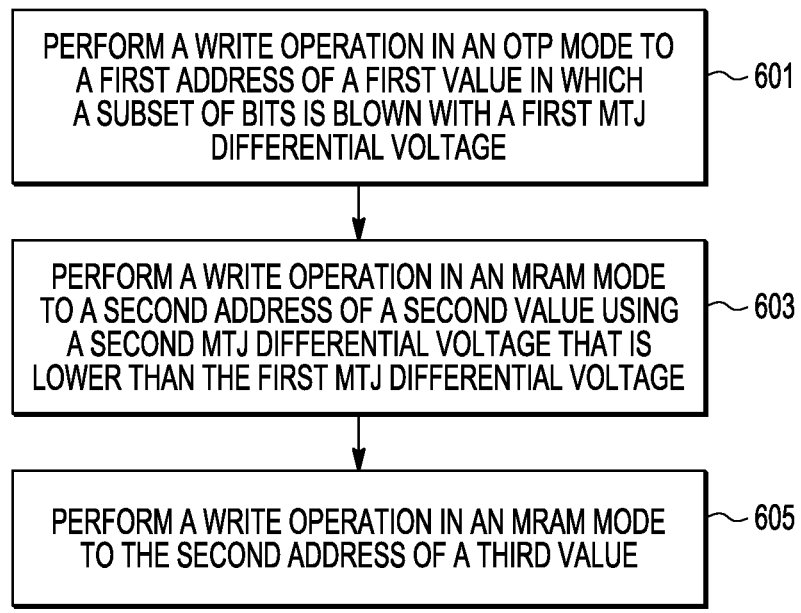
FIG. 6 is a flow chart for a method of writing to an MRAM according to one embodiment of the present invention.

FIG. 6 is a flow chart for a method of writing to an MRAM according to one embodiment of the present invention. In operation 601, a write operation is performed in an OTP mode to a first address of array 103. During the write operation, cells corresponding to a 0 value are blown by generating a voltage differential of VB across the MTJ of the cells. Cells corresponding to a 1 value are not blown. In one embodiment, for cells that are not blown, the bit line voltages and the source line voltages are set to ground. In other embodiments, for the cells that are not blown, a high resistive MRAM value (or low resistive MRAM value) is written to the unblown cell to place the cell in a known resistive MRAM state.

In various embodiments, operation 601 can be performed by the integrated circuit manufacturer, the system manufacturer, or by the end user.

In operation 603, a write operation in an MRAM mode of a second value is performed to write the second value to a second address of the array. In the MRAM mode write, a lower magnitude voltage (VH) differential is applied across the MTJ of the cells of the second address to modulate the magnetization of the free layer to the desired direction. In some embodiments, the polarity of the differential voltage applied across the MTJ determines whether a 1 or 0 is written to the cell.

In various embodiments, operation 603 can be performed by the integrated circuit manufacturer, the system manufacturer, or the end user. In some embodiments, the entity performing operation 603 may be a different entity than the entity performing operation 601.

In operation 605, a write operation in an MRAM mode of a third value is made to the second address to overwrite the second value at the second address.

Figure 7:
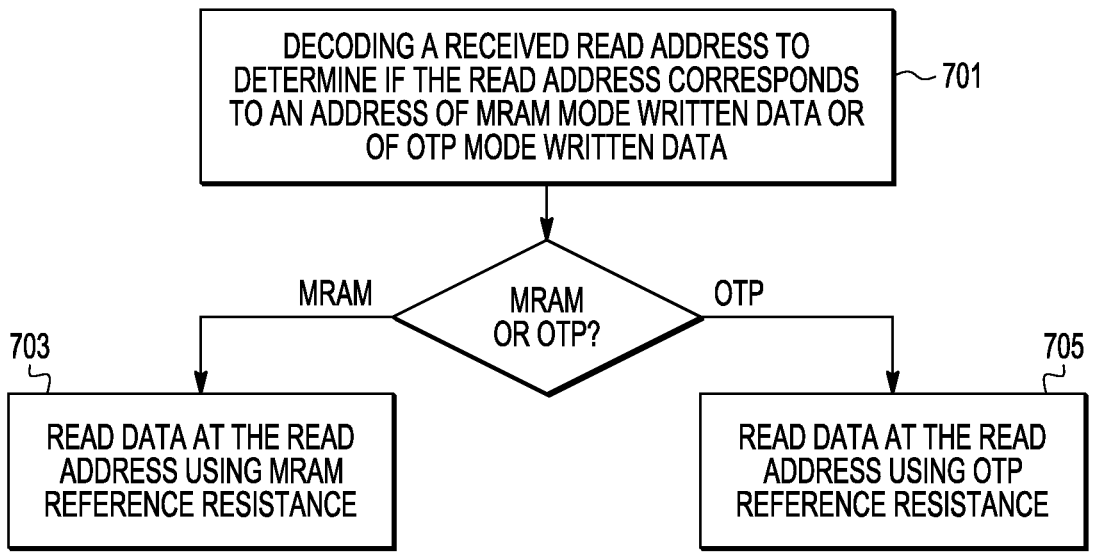
FIG. 7 is a flow chart for a method of reading an MRAM according to an embodiment of the present invention.

FIG. 7 is a flow chart for a method of reading an MRAM according to an embodiment of the present invention. In operation 701, a determination is made as to whether a received read access is to an address of MRAM mode written data or an address of OTP mode written data. In one embodiment, this determination is made by control circuit 127 of FIG. 1 decoding the received address on the ADDRESS lines of a bus from a processing system (not shown).

If the address is an address of MRAM written data, then in operation 703 the data is read in an MRAM mode with the MRAM reference resistance being provided as the reference resistance to the sense amplifiers (137, 139) for the read operation. The MRAM reference resistance is located between the resistance of the high resistance MRAM state (designated RH in FIG. 4) and the resistance of the low resistance MRAM state (designated RL in FIG. 4). In one embodiment, a high resistance MRAM state corresponds to a cell storing a 1 value and a low resistance MRAM state corresponds to a cell storing a 0 value.

If the address is an address of OTP written data, then in operation 705 the data is read in an OTP mode with the OTP reference resistance being provided as the reference resistance to the sense amplifiers (137, 139) for the read operation. The OTP reference resistance is located between the resistance of a blown cell (designated RB in FIG. 4) and the resistance of the low resistance MRAM state (designated RL in FIG. 4). Thus, if a cell has a high MRAM resistance or a low MRAM resistance, a value of 1 will be generated indicating that the cell is an unblown cell. A 0 will be generated when the resistance is the resistance (RB) of a blown cell.

MRAM mode reads and writes and OTP mode reads and writes may be performed with other operations in other embodiments.

In one embodiment, a magnetoresistive random access memory (MRAM) includes an MRAM array including MRAM cells arranged in rows and columns. Each MRAM cell of the MRAM array including a Magnetic Tunnel Junction (MTJ) which includes a corresponding free layer and a corresponding tunnel dielectric layer. The MRAM includes data write circuitry configured to write to MRAM cells of the MRAM array in a one-time-programmable (OTP) write mode or in a non-OTP write mode. In the OTP write mode, the data write circuitry is configured to provide a high write voltage magnitude across selected MRAM cells of a set of MRAM cells of the MRAM array so as to permanently blow the corresponding tunnel dielectric layers of the selected MRAM cells to store a logic value. In the non-OTP write mode, the data write circuitry is configured to provide a lower write voltage magnitude, lower than the high write voltage magnitude, across selected MRAM cells to be written. The lower write voltage magnitude sets a magnetization of a free layer of an MRAM cell of the selected MRAM cells to be written to modulate a resistance of the MRAM cell to a resistive state to store a logic value in the MRAM cell, without blowing the corresponding tunnel dielectric layer of the MRAM cell.

In another embodiment, a magnetoresistive random access memory (MRAM) includes an MRAM array including MRAM cells. Each MRAM cell of the MRAM array including a Magnetic Tunnel Junction (MTJ) which includes a corresponding free layer and a corresponding tunnel dielectric layer. Each MRAM cell of the MRAM array has a same MTJ structure. The MRAM array includes a first plurality of the MRAM cells designated as OTP cells and a second plurality of the MRAM cells designated as non-OTP MRAM cells. The MRAM includes decoder circuitry coupled to receive an access address which addresses a subset of the MRAM cells of the MRAM array for a data access. The MRAM includes data write circuitry configured to write received data to the subset of the MRAM cells using a one-time-programmable (OTP) write mode when the subset of the MRAM cells are in the first plurality of the MRAM cells and the data access is a write access and using a non-OTP write mode when the subset of the MRAM cells are in the second plurality of the MRAM cells and the data access is a write access. The MRAM includes read circuitry configured to read data from a subset of the MRAM cells using an OTP read mode when the subset of the MRAM cells are in the first plurality of the MRAM cells and the data access is a read access and using a non-OTP read mode when the subset of the MRAM cells are in the second plurality of the MRAM cells and the data access is a read access.

In another embodiment, in an MRAM array including MRAM cells, each MRAM cell of the MRAM array includes a Magnetic Tunnel Junction (MTJ) which includes a corresponding free layer and a corresponding tunnel dielectric layer. A method includes performing a write access to a write access address of the MRAM array. The write access address addresses a first plurality of MRAM cells. The method includes determining if the write access requires a one-time-programmable (OTP) write mode or a non-OTP write mode. When the write access requires the OTP write mode, the write access includes providing a high write voltage magnitude across selected MRAM cells of the first plurality of MRAM cells so as to permanently blow the corresponding tunnel dielectric layers of the selected MRAM cells. When the write access requires the non-OTP write mode, the write access includes providing a lower write voltage magnitude, lower than the high write voltage magnitude, across MRAM cells of the first plurality of MRAM cells wherein the lower write voltage magnitude sets a magnetization of a free layer of an MRAM cell of the MRAM cells to modulate a resistance of the MRAM cell to an MRAM resistive state to store a logic value in the MRAM cell, without blowing the corresponding tunnel dielectric layer of the MRAM cell.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A magnetoresistive random access memory (MRAM) comprising:
an MRAM array including MRAM cells arranged in rows and columns, each MRAM cell of the MRAM array including a Magnetic Tunnel Junction (MTJ) which includes a corresponding free layer and a corresponding tunnel dielectric layer;
data write circuitry configured to write to MRAM cells of the MRAM array in a one-time-programmable (OTP) write mode or in a non-OTP write mode, wherein:
in the OTP write mode, the data write circuitry is configured to provide a high write voltage magnitude across selected MRAM cells of a set of MRAM cells of the MRAM array so as to permanently blow the corresponding tunnel dielectric layers of the selected MRAM cells to store a logic value, and
in the non-OTP write mode, the data write circuitry is configured to provide a lower write voltage magnitude, lower than the high write voltage magnitude, across selected MRAM cells to be written, wherein the lower write voltage magnitude sets a magnetization of a free layer of an MRAM cell of the selected MRAM cells to be written to modulate a resistance of the MRAM cell to a resistive state to store a logic value in the MRAM cell, without blowing the corresponding tunnel dielectric layer of the MRAM cell;
read circuitry configured to read MRAM cells of the MRAM array in an OTP read mode or in a non-OTP read mode, wherein:
in the non-OTP read mode, the read circuitry is configured to read data from selected MRAM cells of the MRAM array using an MRAM reference resistance in which a MRAM cell having a high MRAM resistive state has a greater resistance than the MRAM reference resistance and in which an MRAM cell having a low MRAM resistive state has a lower resistance than the MRAM reference resistance, and
in the OTP read mode, the read circuitry is configured to read data from selected MRAM cells of the MRAM array using an OTP reference resistance in which a non-blown MRAM cell has a resistance which is higher than the OTP reference resistance, regardless of an MRAM resistive state of the non-blown MRAM cell, and the OTP reference resistance has a higher resistance than a blown OTP MRAM cell.

2. The MRAM of claim 1, wherein, in the non-OTP write mode, when the lower write voltage magnitude provided across an MRAM cell has a first polarity, a first logic value is stored in the MRAM cell, and when the lower write voltage magnitude provided across the MRAM cell has a second polarity, opposite the first polarity, a second logic value, opposite the first logic value, is stored in the MRAM cell.

3. The MRAM of claim 1, wherein, in the OTP write mode, the data write circuitry is configured to provide a voltage magnitude across non-selected MRAM cells of the set of MRAM cells that does not blow the corresponding tunnel dielectric layers of the non-selected MRAM cells.

4. The MRAM of claim 1, wherein MRAM array is configured to receive an access address to indicate a set of MRAM cells to be written, the MRAM further comprising a control circuit configured to receive the access address and generate the OTP mode indicator based on the access address, wherein the data write circuitry is configured to write to MRAM cells of the MRAM array in the OTP write mode or in the non-OTP write mode based on an OTP mode indicator.

5. The MRAM of claim 4, wherein the control circuit comprises storage circuitry configured to store addresses of the MRAM array which are designated as OTP addresses, wherein if the access address is designated as an OTP address in the storage circuitry, the OTP mode indicator indicates the OTP write mode when writing to the access address.

6. The MRAM of claim 1, wherein the MRAM array is configured to receive a read access address indicating selective MRAM cells to be read, wherein if the read access address corresponds to an OTP address of the MRAM array, the selected MRAM cells are read in an OTP read mode, and if the read access address corresponds to a non-OTP address of the MRAM array, the selected MRAM cells are read in the non-OTP read mode.

7. The MRAM of claim 1 wherein the read circuitry includes a plurality of sense amplifiers each for comparing a resistance of an MRAM cell against a reference resistance during a data read, wherein in the OTP read mode, the plurality of sense amplifiers use the OTP reference resistance as the reference resistance, and in the non-OTP read mode, the plurality of sense amplifiers use the MRAM reference resistance as the reference resistance.

8. The MRAM of claim 1, wherein the write circuitry writes data to a first plurality of rows of the MRAM array in the OTP write mode and the write circuitry writes data to a second plurality of rows of the MRAM array in the non-OTP write mode.

9. The MRAM of claim 1, wherein every MRAM cell of the MRAM array has a same MTJ structure.

10. A magnetoresistive random access memory (MRAM) comprising:
- an MRAM array including MRAM cells, each MRAM cell of the MRAM array including a Magnetic Tunnel Junction (MTJ) which includes a corresponding free layer and a corresponding tunnel dielectric layer, wherein each MRAM cell of the MRAM array has a same MTJ structure, and the MRAM array includes:
  - a first plurality of the MRAM cells designated as OTP cells, and
  - a second plurality of the MRAM cells designated as non-OTP MRAM cells;
- decoder circuitry coupled to receive an access address which addresses a subset of the MRAM cells of the MRAM array for a data access;
- data write circuitry configured to write received data to the subset of the MRAM cells using a one-time-programmable (OTP) write mode when the subset of the MRAM cells are in the first plurality of the MRAM cells and the data access is a write access and using a non-OTP write mode when the subset of the MRAM cells are in the second plurality of the MRAM cells and the data access is a write access; and
- read circuitry configured to read data from a subset of the MRAM cells using an OTP read mode when the subset of the MRAM cells are in the first plurality of the MRAM cells and the data access is a read access and using a non-OTP read mode when the subset of the MRAM cells are in the second plurality of the MRAM cells and the data access is a read access.

11. The MRAM of claim 10, wherein:
- in the OTP write mode, the data write circuitry is configured to provide a high write voltage magnitude across selected MRAM cells of a subset of the MRAM cells so as to permanently blow the corresponding tunnel dielectric layers of the selected MRAM cells to store a logic value, and
- in the non-OTP write mode, the data write circuitry is configured to provide a lower write voltage magnitude, lower than the high write voltage magnitude, across MRAM cells of a subset of the MRAM cells to be written, wherein the lower write voltage magnitude sets a magnetization of a free layer of an MRAM cell of the subset of the MRAM cells to modulate a resistance of the MRAM cell to an MRAM resistive state to store a logic value without blowing the corresponding tunnel dielectric layer of the MRAM cell.

12. The MRAM of claim 11, wherein, in the non-OTP write mode, when the lower write voltage magnitude provided across an MRAM cell of the subset of the MRAM cells has a first polarity, a first logic value is stored in the MRAM cell, and when the lower write voltage magnitude provided across an MRAM cell of the subset of the MRAM cells has a second polarity, opposite the first polarity, a second logic value, opposite the first logic value, is stored in the MRAM cell.

13. The MRAM of claim 11, wherein the data write circuitry is configured to write a high resistive RAM state or a low MRAM resistive state to non-selected MRAM cells of the subset of the MRAM cells which have not been blown.

14. The MRAM of claim 11, wherein in the OTP write mode, the data write circuitry is configured to provide a voltage magnitude across non-selected MRAM cells of the subset of MRAM cells so as not to blow the corresponding tunnel dielectric layers of the non-selected MRAM cells of the subset.

15. The MRAM of claim 10, wherein:
- in the non-OTP read mode, the read circuitry is configured to read data from the subset of the MRAM cells using an MRAM reference resistance in which an MRAM cell of the MRAM array having a high MRAM resistive state has a greater resistance than the MRAM reference resistance and in which an MRAM cell of the MRAM array having a low MRAM resistive state has a lower resistance than the MRAM reference resistance;
- in the OTP read mode, the read circuitry is configured to read data from the subset of the MRAM cells using an OTP reference resistance in which a non-blown MRAM cell has a resistance which is higher than the OTP reference resistance, regardless of an MRAM resistive state of the non-blown MRAM cell, and the OTP reference resistance has a higher resistance than a blown MRAM.

16. The MRAM of claim 15 wherein the read circuitry includes a plurality of sense amplifiers each for comparing a resistance of an MRAM cell against a reference resistance during a data read, wherein in the OTP read mode, the plurality of sense amplifiers use the OTP reference resistance as the reference resistance, and in the non-OTP read mode, the plurality of sense amplifiers use the MRAM reference resistance as the reference resistance.

17. The MRAM of claim 10, further comprising storage circuitry configured to store an indication of addresses of the OTP cells.

18. The MRAM of claim 10, wherein the first plurality of the MRAM cells includes one or more rows of the MRAM array.

19. In an MRAM array including MRAM cells, each MRAM cell of the MRAM array including a Magnetic Tunnel Junction (MTJ) which includes a corresponding free layer and a corresponding tunnel dielectric layer, a method comprises:
- performing a write access to a write access address of the MRAM array, wherein the write access address addresses a first plurality of MRAM cells;

determining if the write access requires a one-time-programmable (OTP) write mode or a non-OTP write mode;

when the write access requires the OTP write mode, the write access comprises:

providing a high write voltage magnitude across selected MRAM cells of the first plurality of MRAM cells so as to permanently blow the corresponding tunnel dielectric layers of the selected MRAM cells; and when the write access requires the non-OTP write mode, the write access comprises:

providing a lower write voltage magnitude, lower than the high write voltage magnitude, across MRAM cells of the first plurality of MRAM cells wherein the lower write voltage magnitude sets a magnetization of a free layer of an MRAM cell of the MRAM cells to modulate a resistance of the MRAM cell to an MRAM resistive state to store a logic value in the MRAM cell, without blowing the corresponding tunnel dielectric layer of the MRAM cell;

performing a read access to a read access address of the MRAM array, wherein the read access address addresses a second plurality of MRAM cells;

determining if the read access address requires an OTP read mode or a non-OTP read mode;

when the read access address requires the OTP read mode, the method comprises:

reading data from the second plurality of MRAM cells using an MRAM reference resistance in which an MRAM cell having a high MRAM resistive state has a greater resistance than the MRAM reference resistance and in which an MRAM cell having a low MRAM resistive state has a lower resistance than the MRAM reference resistance; and when the read access address requires the non-OTP read mode, the method comprises:

reading data from the second plurality of MRAM cells using an OTP reference resistance in which a non-blown MRAM cell has a resistance which is higher than the OTP reference, regardless of an MRAM resistive state of the non-blown MRAM cell, and the OTP reference resistance has a higher resistance than a blown OTP MRAM cell.

20. The method of claim 19, wherein the determining if the write access requires an OTP write mode or a non-OTP write mode and the determining if the read access address requires an OTP read mode or a non-OTP read mode, comprises accessing storage circuitry to determine whether the write access address or the read access address is indicated as an OTP address.

* * * * *